(12) United States Patent
Niimi et al.

(10) Patent No.: US 9,805,986 B2
(45) Date of Patent: Oct. 31, 2017

(54) HIGH MOBILITY TRANSISTORS

(71) Applicant: Texas Instruments Incorporated, Dallas, TX (US)

(72) Inventors: Hiroaki Niimi, Cohoes, NY (US); Manoj Mehrotra, Bangalore (IN); Rick L. Wise, Fairview, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/079,414

(22) Filed: Mar. 24, 2016

(65) Prior Publication Data

US 2016/0225673 A1 Aug. 4, 2016

Related U.S. Application Data

(62) Division of application No. 14/573,021, filed on Dec. 17, 2014, now Pat. No. 9,324,717.

(60) Provisional application No. 61/921,453, filed on Dec. 28, 2013.

(51) Int. Cl.
| | | |
|---|---|---|
| H01L 21/84 | (2006.01) | |
| H01L 21/8238 | (2006.01) | |
| H01L 29/10 | (2006.01) | |
| H01L 29/161 | (2006.01) | |
| H01L 29/20 | (2006.01) | |

(52) U.S. Cl.
CPC ......... *H01L 21/823807* (2013.01); *H01L 21/823821* (2013.01); *H01L 21/823878* (2013.01); *H01L 29/1054* (2013.01); *H01L 29/161* (2013.01); *H01L 29/20* (2013.01)

(58) Field of Classification Search
CPC ..... H01L 21/823431; H01L 21/823821; H01L 21/845
See application file for complete search history.

(56) References Cited

U.S. PATENT DOCUMENTS

| | | |
|---|---|---|
| 9,023,705 B1 | 5/2015 | Paul et al. |
| 2013/0307021 A1 | 11/2013 | Ching et al. |
| 2014/0011341 A1 | 1/2014 | Maszara et al. |
| 2014/0061820 A1 | 3/2014 | Reznicek et al. |
| 2014/0353767 A1 | 12/2014 | Liu et al. |
| 2015/0162403 A1 | 6/2015 | Oxland |
| 2016/0211263 A1* | 7/2016 | Goel ............... H01L 29/785 |

* cited by examiner

*Primary Examiner* — Jae Lee
(74) *Attorney, Agent, or Firm* — Jacqueline J. Garner; Charles A. Brill; Frank D. Cimino

(57) ABSTRACT

An integrated circuit containing an n-channel finFET and a p-channel finFET has a dielectric layer over a silicon substrate. The fins of the finFETs have semiconductor materials with higher mobilities than silicon. A fin of the n-channel finFET is on a first silicon-germanium buffer in a first trench through the dielectric layer on the substrate. A fin of the p-channel finFET is on a second silicon-germanium buffer in a second trench through the dielectric layer on the substrate. The fins extend at least 10 nanometers above the dielectric layer. The fins are formed by epitaxial growth on the silicon-germanium buffers in the trenches in the dielectric layer, followed by CMP planarization down to the dielectric layer. The dielectric layer is recessed to expose the fins. The fins may be formed concurrently or separately.

14 Claims, 21 Drawing Sheets

HIGH MOBILITY TRANSISTORS

CROSS-REFERENCE TO RELATED APPLICATIONS

This application is a divisional of U.S. Nonprovisional patent application Ser. No. 14/573,021, filed Dec. 17, 2014, which claims the benefit of U.S. provisional application Ser. No. 61/921,453, filed Dec. 28, 2013, the contents of both of which are herein incorporated by reference in its entirety.

FIELD OF THE INVENTION

This invention relates to the field of integrated circuits. More particularly, this invention relates to MOS transistors in integrated circuits.

BACKGROUND OF THE INVENTION

Integrated circuits having fin field effect transistors (fin-FETs) attain high gate density, but lack transistor performance offered by planar transistors using high mobility materials such as III-V materials or germanium. Integrating high mobility materials into high density integrated circuits has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an n-channel finFET and a p-channel finFET may be formed by forming a dielectric layer over a silicon substrate. A first trench for a fin of the n-channel finFET is formed through the dielectric layer. A first silicon-germanium buffer is formed on the substrate in the first trench, and the n-channel fin of the n-channel finFET is formed by epitaxial growth on the first silicon-germanium buffer layer. A second trench for a p-channel fin of the p-channel finFET is formed through the dielectric layer. A second silicon-germanium buffer is formed on the substrate in the second trench, and the p-channel fin is formed by epitaxial growth on the second silicon-germanium buffer layer. Subsequently, the dielectric layer is recessed to expose the fins.

DETAILED DESCRIPTION OF EXAMPLE EMBODIMENTS

Figure 1:
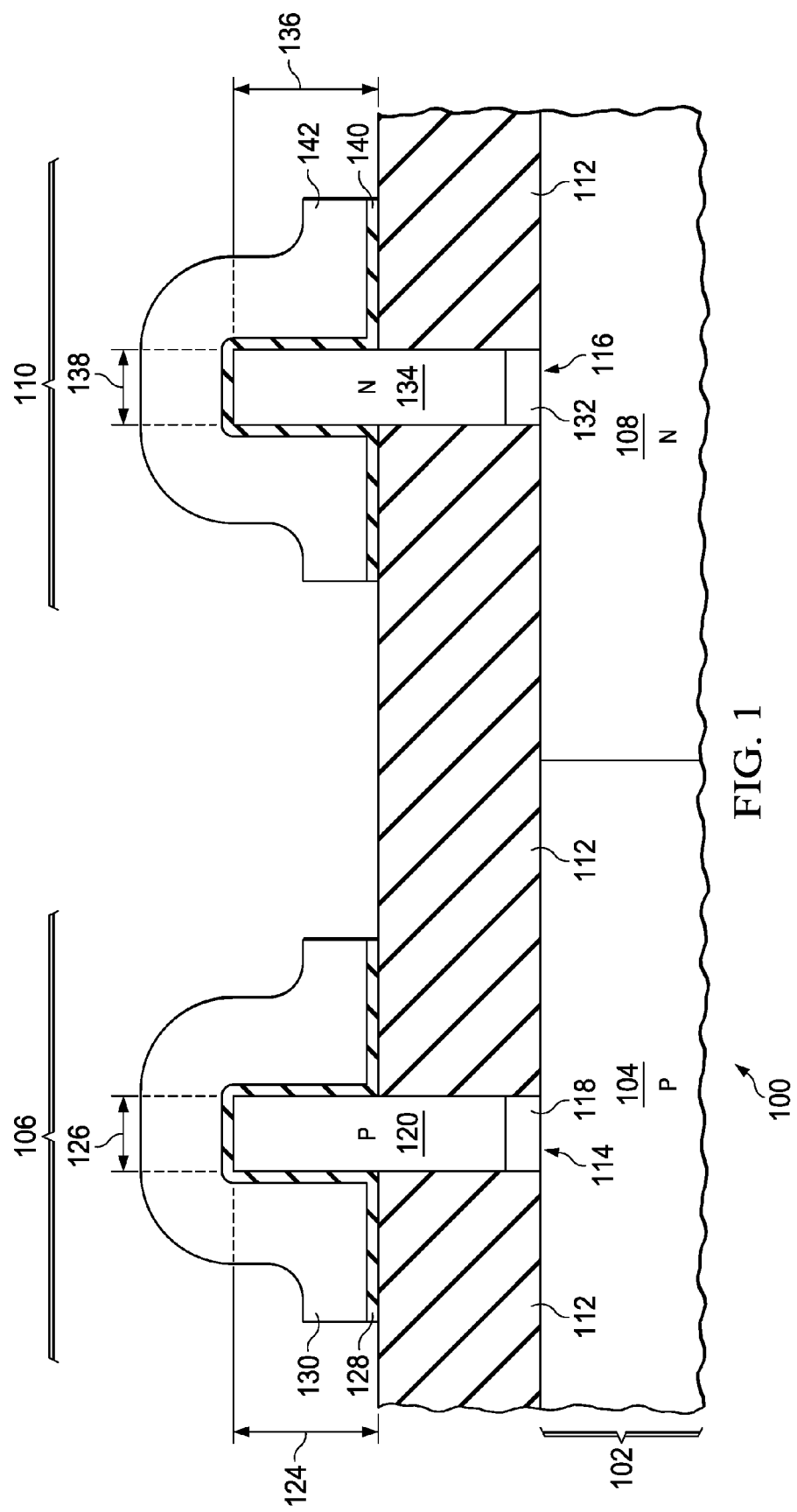
FIG. 1 is a cross section of an example integrated circuit containing an n-channel finFET and a p-channel finFET.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an n-channel finFET and a p-channel finFET may be formed by either of two process sequences. In the first sequence, a dielectric layer is formed over a silicon substrate. A first trench for an n-channel fin of the n-channel finFET is formed through the dielectric layer to expose the substrate. A first silicon-germanium buffer is formed on the substrate in the first trench, and the n-channel fin is formed by epitaxial growth of high electron mobility material on the first silicon-germanium buffer layer, extending above the dielectric layer. An epitaxy blocking layer is formed over the dielectric layer and the n-channel fin. A second trench for a p-channel fin of the p-channel finFET is formed through the cap layer and the dielectric layer to expose the substrate. A second silicon-germanium buffer is formed on the substrate in the second trench, and the p-channel fin is formed by epitaxial growth of high hole mobility material on the second silicon-germanium buffer layer, extending above the dielectric layer. The n-channel fin and the p-channel fin may each be doped during growth. A cap layer is formed over the epitaxy blocking layer and the p-channel fin. A CMP process removes the cap layer and the epitaxy blocking layer and planarizes the n-channel fin and the p-channel fin down to the dielectric layer. Subsequently, the dielectric layer is recessed to expose the n-channel fin and the p-channel fin. Subsequently, gate dielectric layers are formed over the n-channel fin and the p-channel fin and gates are formed on the gate dielectric layer.

In the second sequence, a dielectric layer is formed over a silicon substrate, and the first trench for the n-channel fin and the second trench for the p-channel fin are formed concurrently through the dielectric layer to expose the substrate. The first silicon-germanium buffer and the second silicon-germanium buffer are concurrently formed on the substrate in the first trench and in the second trench, respectively. The n-channel fin and the p-channel fin are concurrently formed by epitaxial growth of high mobility material on the first silicon-germanium buffer and on the second silicon-germanium buffer layer, respectively, extending above the dielectric layer. The n-channel fin and the p-channel fin may possibly be doped during formation, and one fin implanted with dopants to counterdope the in-situ dopants. Alternatively, the n-channel fin and the p-channel fin may be implanted with dopants to provide desired doping densities. A cap layer is formed over the dielectric layer and the n-channel fin and the p-channel fin. A CMP process removes the cap layer and planarizes the n-channel fin and the p-channel fin down to the dielectric layer. Subsequently, the dielectric layer is recessed to expose the n-channel fin and the p-channel fin. Subsequently, gate dielectric layers are formed over the n-channel fin and the p-channel fin and gates are formed on the gate dielectric layer.

FIG. 1 is a cross section of an example integrated circuit containing an n-channel finFET and a p-channel finFET. The integrated circuit 100 is formed on a single crystal silicon substrate 102 which includes a p-type region 104 in an area for the n-channel finFET 106, and includes an n-type region 108 in an area for the p-channel finFET 110. The substrate 102 may be a bulk silicon wafer, or an epitaxial layer on a silicon wafer. A dielectric layer 112 is disposed over the substrate 102. The dielectric layer 112 may include one or more layers of silicon dioxide, and possibly other dielectric material such as silicon oxynitride and/or boron phosphorus silicate glass (BPSG). The dielectric layer 112 may be 20 nanometers to 40 nanometers thick. A first trench 114 is disposed through the dielectric layer 112 in the area for the n-channel finFET 106. A second trench 116 is disposed through the dielectric layer 112 in the area for the p-channel finFET 110.

The n-channel finFET 106 includes a first silicon-germanium buffer 118 disposed on the p-type region 104 of the substrate 102 in the first trench 114. The first silicon-germanium buffer 118 may be 1 nanometer to 5 nanometers thick, and may have a graded composition such that the first silicon-germanium buffer 118 has a germanium atomic fraction at the substrate 102 of less than 20 percent and has a germanium atomic fraction at a top surface of the first silicon-germanium buffer 118 over 80 percent. The n-channel finFET 106 includes an n-channel fin 120 on the first silicon-germanium buffer 118, extending above a top surface 122 of the dielectric layer 112 by an exposure height 124 of at least 10 nanometers. The exposure height 124 may be 20 nanometers to 40 nanometers. An average width 126 of the n-channel fin 120 above the top surface 122 of the dielectric layer 112 may be less than 30 nanometers, for example 10 nanometers to 20 nanometers. The n-channel fin 120 substantially fills the first trench 114 at the top surface 122 of the dielectric layer 112. The n-channel fin 120 is doped p-type to provide a desired threshold voltage for the n-channel finFET 106. The n-channel fin 120 is primarily semiconductor material different from silicon, possibly with an electron mobility higher than silicon. The semiconductor material may be, for example, a III-V compound semiconductor material such as gallium arsenide, indium gallium arsenide, possibly with an indium to gallium ratio of 50:50 to 57:43, or indium phosphide. Alternatively, the semiconductor material may be germanium or silicon-germanium with a germanium atomic fraction greater than 80 percent. Forming the n-channel fin 120 with the semiconductor material having an electron mobility higher than silicon advantageously provides a desired on-state current in the n-channel finFET 106. The n-channel finFET 106 includes a first gate dielectric layer 128 disposed over, and extending along sides of, the n-channel fin 120. The n-channel finFET 106 includes a first gate 130 disposed over the first gate dielectric layer 128, extending at least partway down to the top surface 122 of the dielectric layer 112. The first gate 130 may include polycrystalline silicon, referred to as polysilicon, may include metal silicide, or may be a metal gate.

The p-channel finFET 110 includes a second silicon-germanium buffer 132 disposed on the n-type region 108 of the substrate 102 in the second trench 116. The second silicon-germanium buffer 132 may also be 1 nanometer to 5 nanometers thick, and may also have a graded composition similar to the first silicon-germanium buffer 118. The p-channel finFET 110 includes a p-channel fin 134 on the second silicon-germanium buffer 132, extending above the top surface 122 of the dielectric layer 112 by an exposure height 136 of at least 10 nanometers. The exposure height 136 of the p-channel fin 134 may be substantially equal to the exposure height 124 of the n-channel fin 120. An average width 138 of the p-channel fin 134 above the top surface 122 of the dielectric layer 112 may also be less than 30 nanometers, for example 10 nanometers to 20 nanometers. The p-channel fin 134 substantially fills the second trench 116 at the top surface 122 of the dielectric layer 112. The p-channel fin 134 is doped n-type to provide a desired threshold voltage for the p-channel finFET 110. The p-channel fin 134 is primarily semiconductor material different from silicon, possibly with a hole mobility higher than silicon. The semiconductor material may be, for example, a III-V compound semiconductor material such as gallium arsenide, or may be germanium or silicon-germanium with a germanium atomic fraction greater than 80 percent. In one version of the instant example, the n-channel fin 120 and the p-channel fin 134 may be primarily formed of the same semiconductor material. Forming the p-channel fin 134 with the semiconductor material having a hole mobility higher than silicon advantageously provides a desired on-state current in the p-channel finFET 110. The p-channel finFET 110 includes a second gate dielectric layer 140 disposed over, and extending along sides of, the p-channel fin 134. The p-channel finFET 110 includes a second gate 142 disposed over the second gate dielectric layer 140, extending at least partway down to the top surface 122 of the dielectric layer 112. The second gate 142 may include polysilicon, may include metal silicide, or may be a metal gate.

Figure 2A:
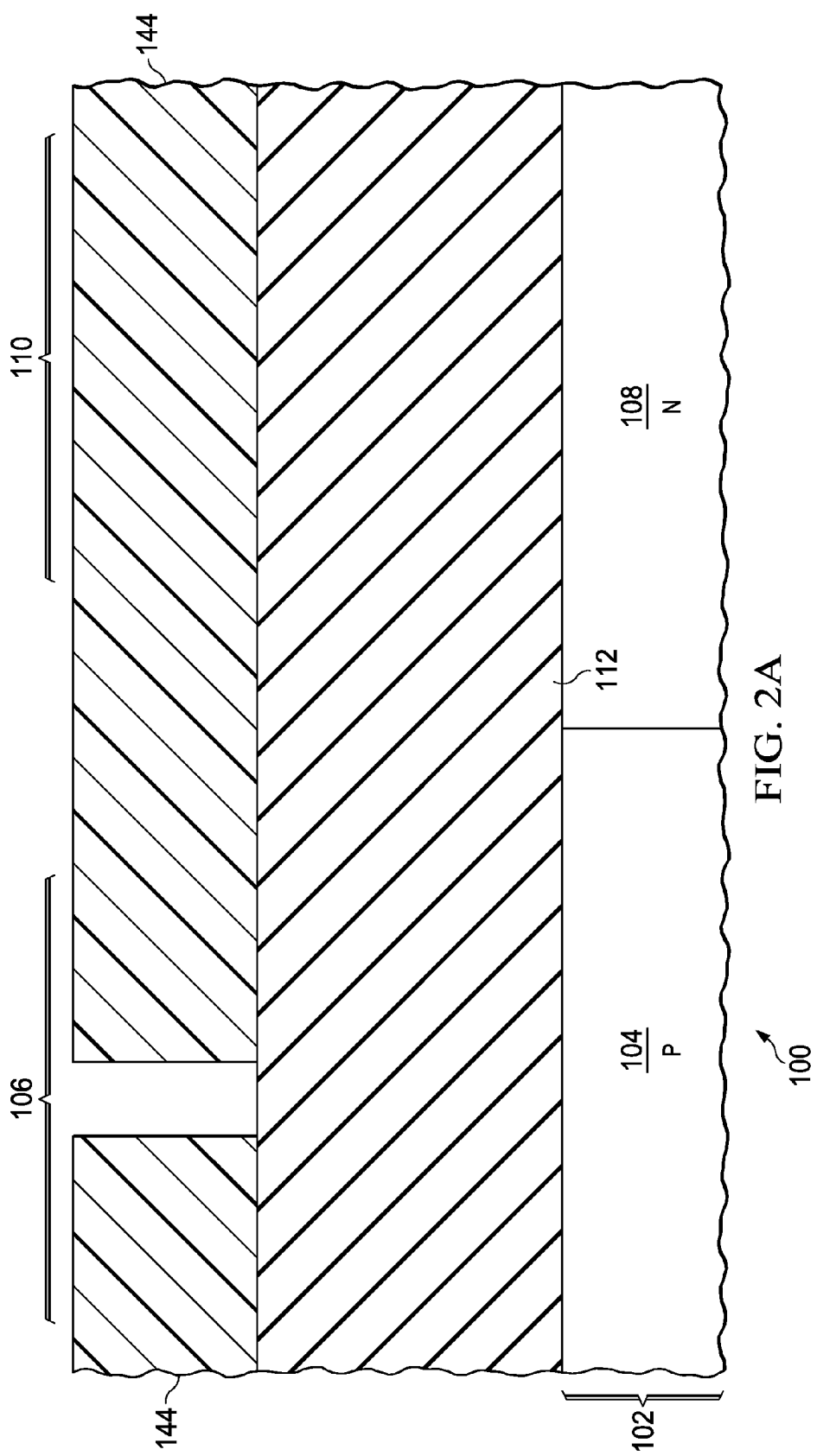
FIG. 2A through FIG. 2M are cross sections of the integrated circuit of FIG. 1, depicted in successive stages of an example fabrication sequence.

FIG. 2A through FIG. 2M are cross sections of the integrated circuit of FIG. 1, depicted in successive stages of an example fabrication sequence. Referring to FIG. 2A, the silicon substrate 102 is provided for forming the integrated circuit 100. The dielectric layer 112 is formed over the substrate 102 with an initial thickness of 50 nanometers to 100 nanometers. The dielectric layer 112 may be formed by thermal oxidation of the silicon in the substrate 102, or may be formed by a deposition process, such as a plasma enhanced chemical vapor deposition (PECVD) process using tetraethyl orthosilicate, also known as tetraethoxysilane (TEOS). The dielectric layer 112 may include one or more layers of other dielectric material such as silicon oxynitride or BPSG.

A first trench mask 144 is formed over the dielectric layer 112 so as to expose an area for the first trench 114 of FIG. 1 and to cover the area for the p-channel finFET 110. The first trench mask 144 may include an antireflection layer and a photoresist pattern formed by a photolithographic process.

Figure 2B:
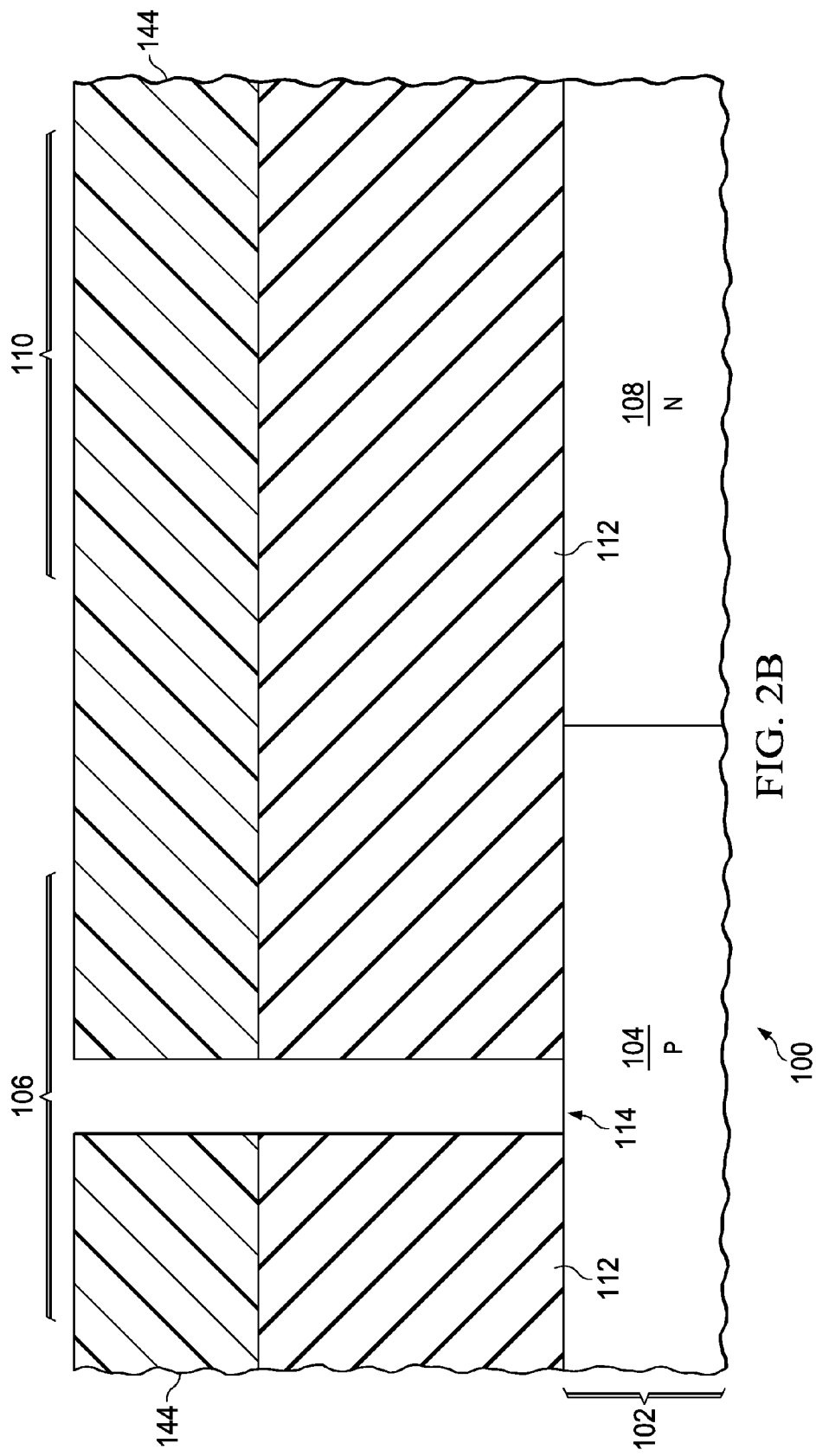

Referring to FIG. 2B, the first trench 114 is formed through the dielectric layer 112 to expose the substrate 102 by etching the dielectric layer 112 in areas exposed by the first trench mask 144. The dielectric layer 112 may be etched using a reactive ion etch (RIE) process. After the first trench 114 is formed, the first trench mask 144 is removed, for example by ashing followed by a wet clean process.

Figure 2C:
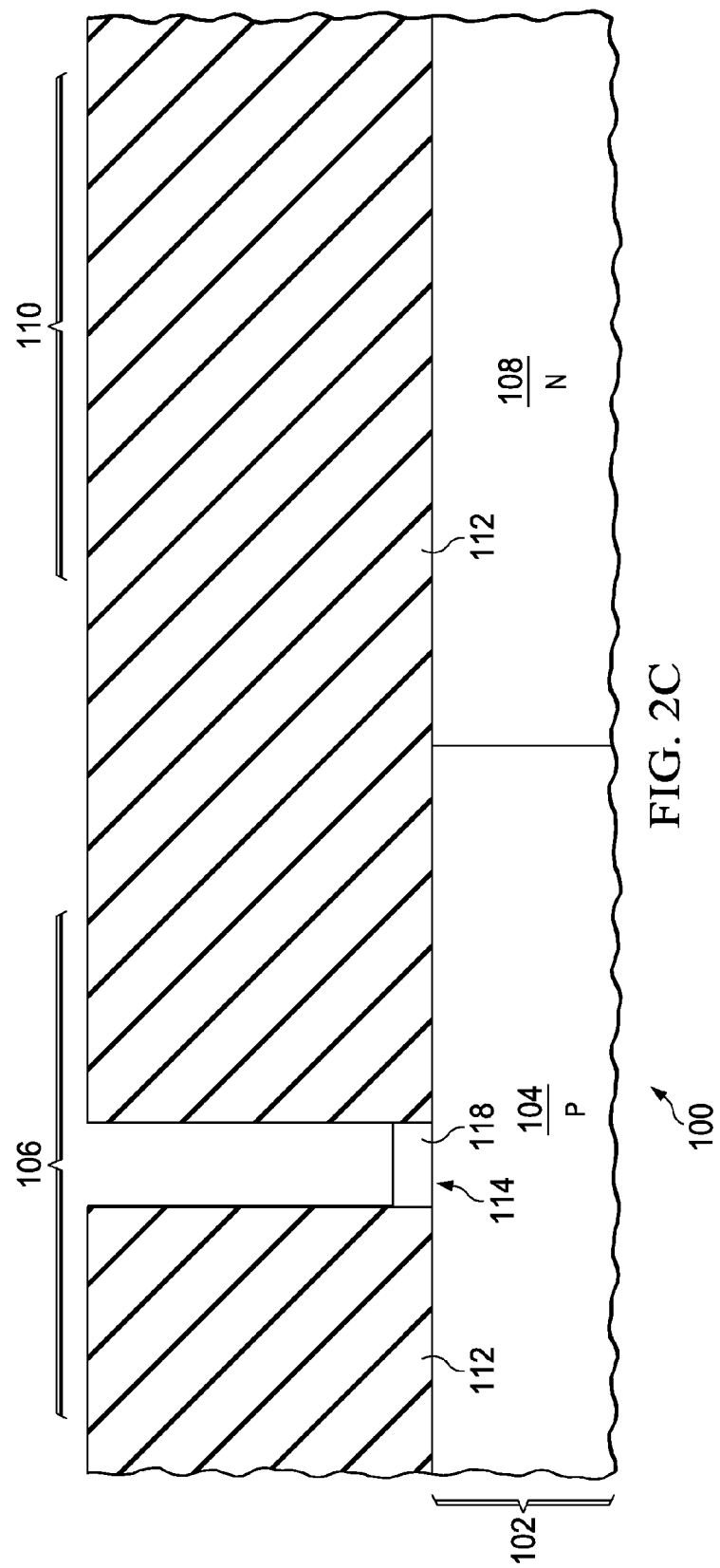

Referring to FIG. 2C, the first silicon-germanium buffer 118 is formed on the substrate 102 in the first trench 114. Formation of the first silicon-germanium buffer 118 may be preceded by a hydrogen bake at 750° C. to 850° C. The first silicon-germanium buffer 118 may be grown by an epitaxial process using silane or dichlorosilane and germane with hydrogen chloride at a temperature of 750° C. to 850° C. The ratio of silane or dichlorosilane to germane may be varied so that the atomic fraction of germanium at the substrate 102 is less than 20 percent and the atomic fraction of germanium at the top of the first silicon-germanium buffer 118 is greater than 80 percent, to advantageously provide good lattice matching to the substrate 102 and to the to-be-formed n-channel fin 120. The epitaxy process used to form the first silicon-germanium buffer 118 does not deposit silicon-germanium on sidewalls of the first trench 114 so as to significantly reduce a width of the first trench 114.

Figure 2D:
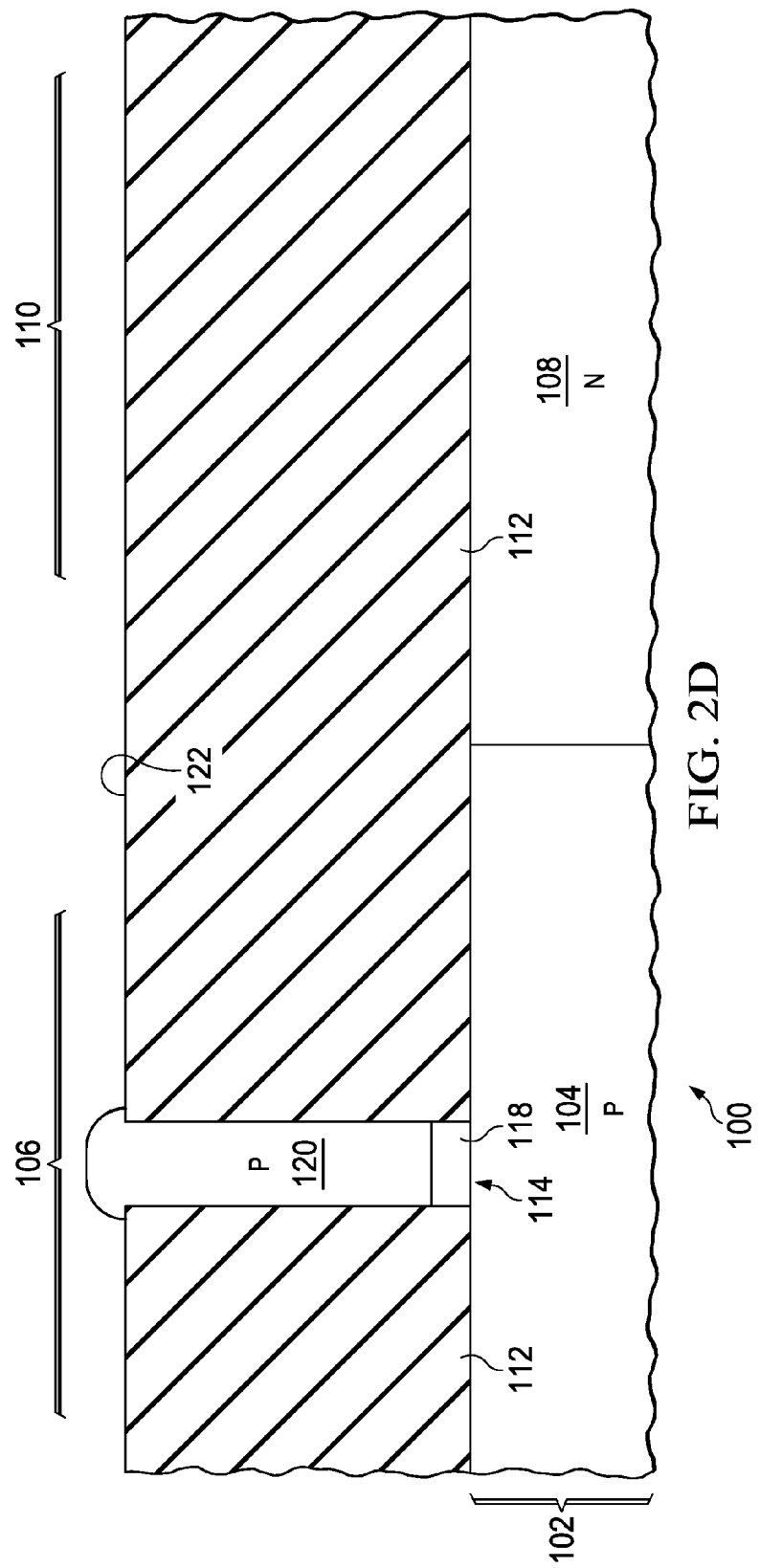

Referring to FIG. 2D, the n-channel fin 120 may be formed by a vapor phase epitaxial process on the first silicon-germanium buffer 118, extending past the top surface 122 of the dielectric layer 112. The first silicon-germanium buffer 118 advantageously facilitates epitaxial growth of the semiconductor material of the n-channel fin 120, which would be problematic to grow directly on the silicon substrate 102. In a version of the instant example in which the n-channel fin 120 is primarily indium gallium arsenide, the epitaxial process may use trimethyl indium, trimethyl gallium or triethyl gallium, and arsine at a pressure of 150 torr and a temperature of 750° C. to 850° C. A ratio of the trimethyl indium to the trimethyl gallium may be varied to obtain a desired ratio of indium to gallium in the n-channel fin 120. In a version of the instant example in which the n-channel fin 120 is primarily gallium arsenide, the epitaxial process may use trimethyl gallium or triethyl gallium and arsine. In a version of the instant example in which the n-channel fin 120 is primarily indium phosphide, the epitaxial process may use trimethyl indium and phosphine. In a version of the instant example in which the n-channel fin 120 is primarily germanium, the epitaxial process may use germane. In a version of the instant example in which the n-channel fin 120 is primarily silicon-germanium, the epitaxial process may use silane or dichlorosilane and germane. Alternatively, the n-channel fin 120 may be formed by a molecular beam epitaxy (MBE) process.

Figure 2E:
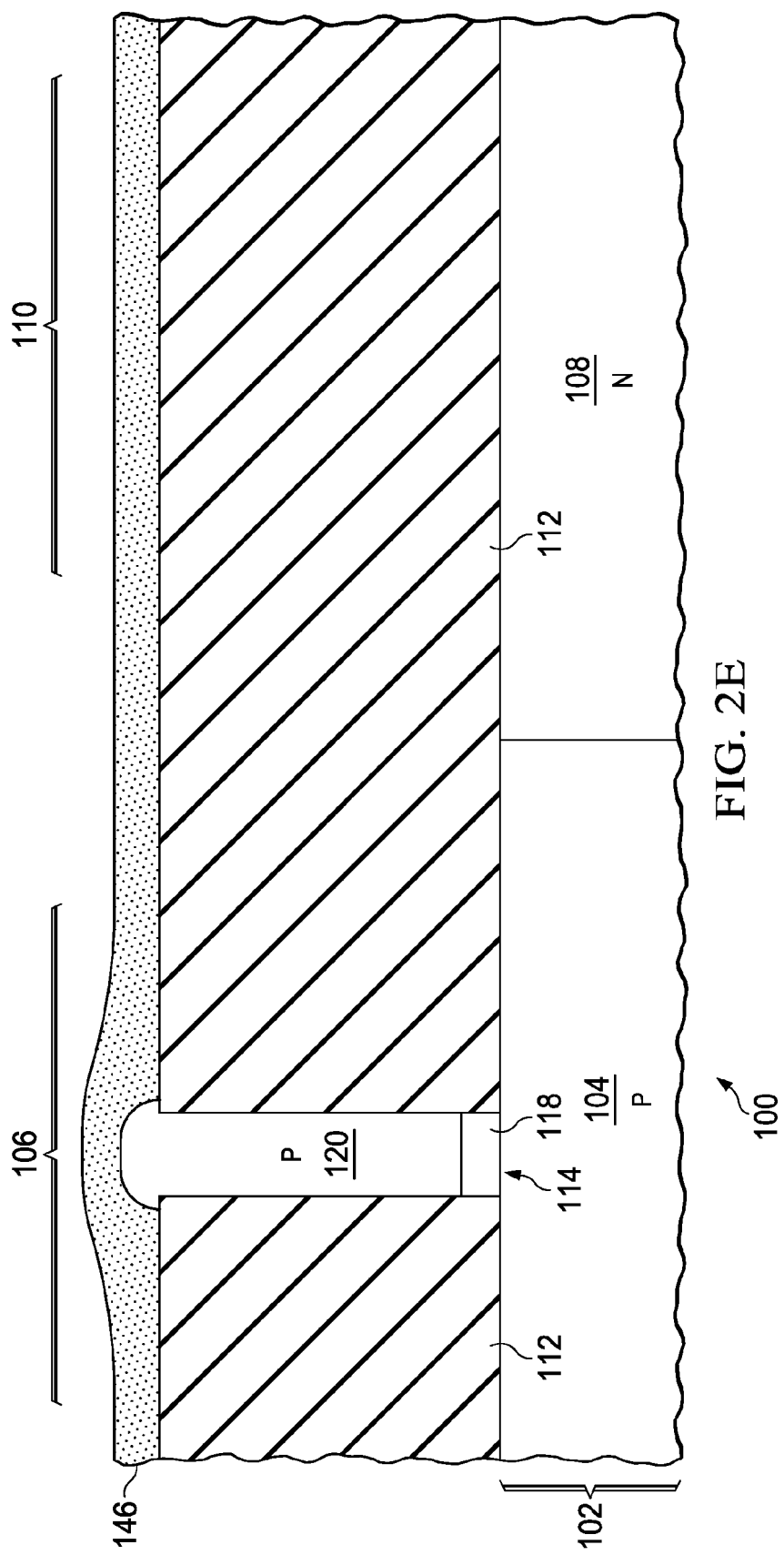

Referring to FIG. 2E, an epitaxy blocking layer 146 is formed over the dielectric layer 112, covering the n-channel fin 120. The epitaxy blocking layer 146 may include silicon nitride or silicon oxynitride, 20 nanometers to 30 nanometers thick. The epitaxy blocking layer 146 may be formed by a low pressure chemical vapor deposition (LPCVD) process using dichlorosilane and ammonia at 650° C. to 750° C.

Figure 2F:
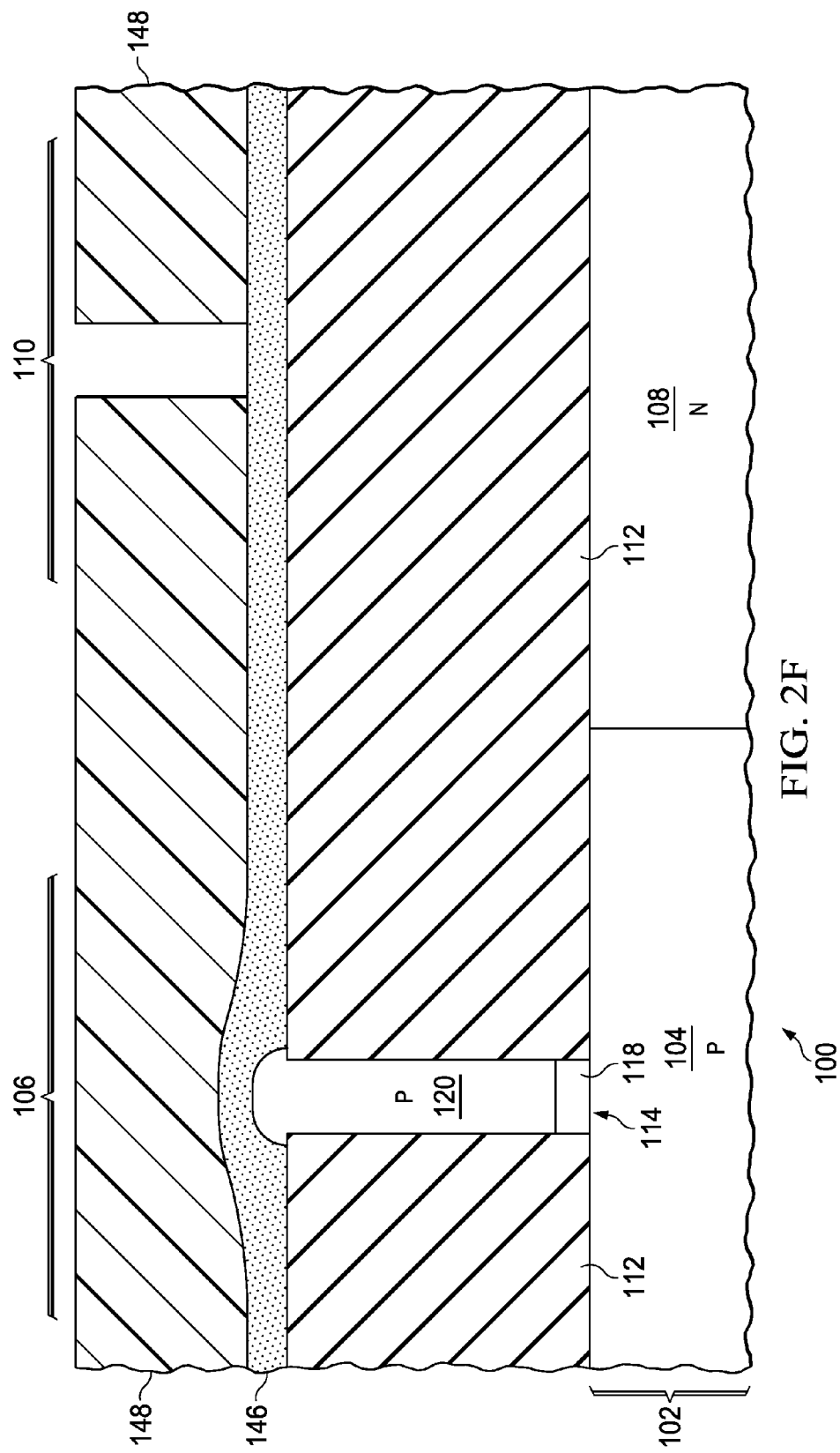

Referring to FIG. 2F, a second trench mask 148 is formed over the epitaxy blocking layer 146 so as to expose an area for the second trench 116 of FIG. 1 and to cover the area for the n-channel finFET 106. The second trench mask 148 may include an antireflection layer and a photoresist pattern formed by a photolithographic process.

Figure 2G:
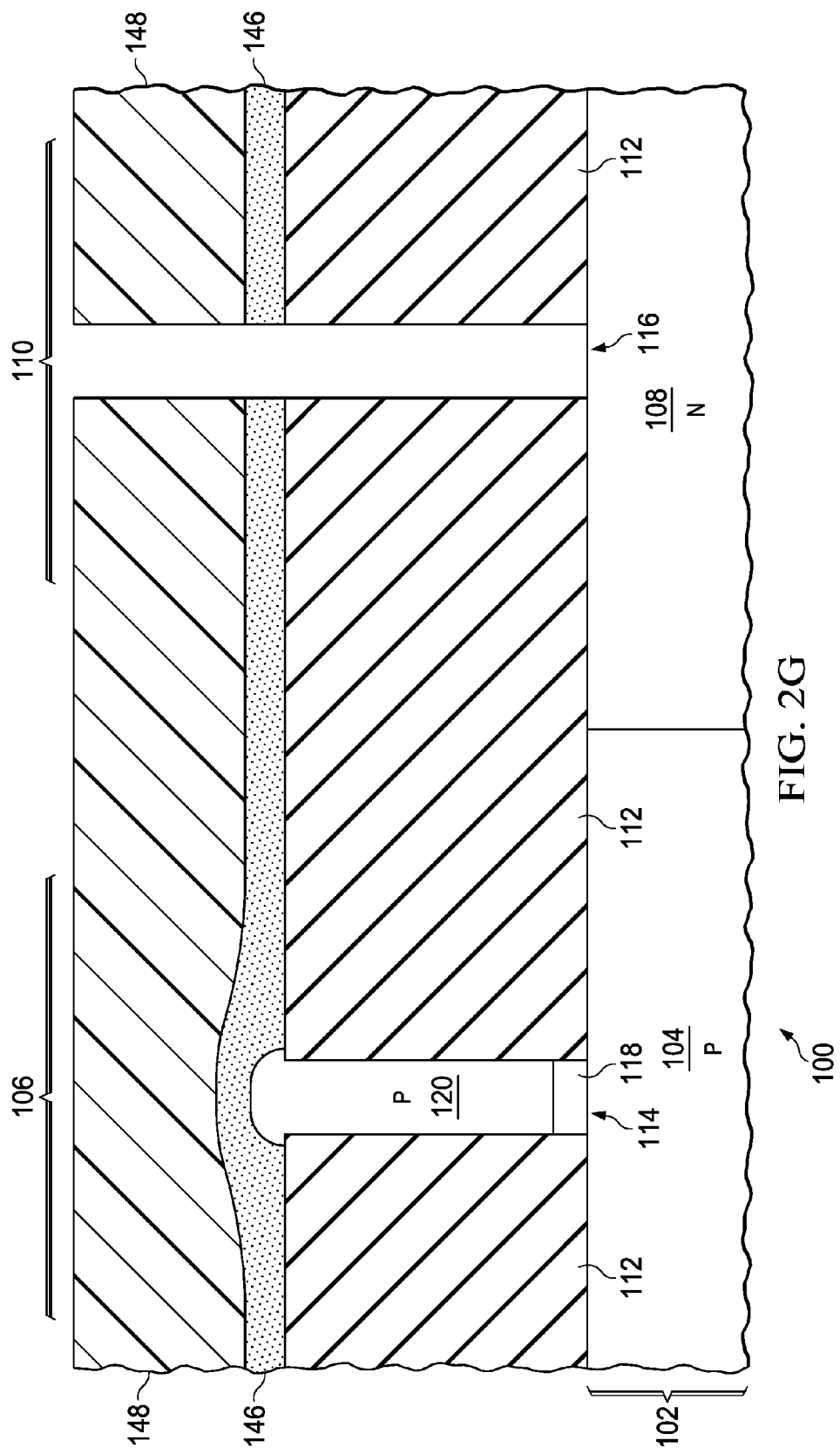

Referring to FIG. 2G, the second trench 116 is formed through the epitaxy blocking layer 146 and the dielectric layer 112 to expose the substrate 102 by etching the epitaxy blocking layer 146 and the dielectric layer 112 in areas exposed by the second trench mask 148. The epitaxy blocking layer 146 and the dielectric layer 112 may be etched using an RIE process. After the second trench 116 is formed, the second trench mask 148 is removed, for example by ashing followed by a wet clean process.

Figure 2H:
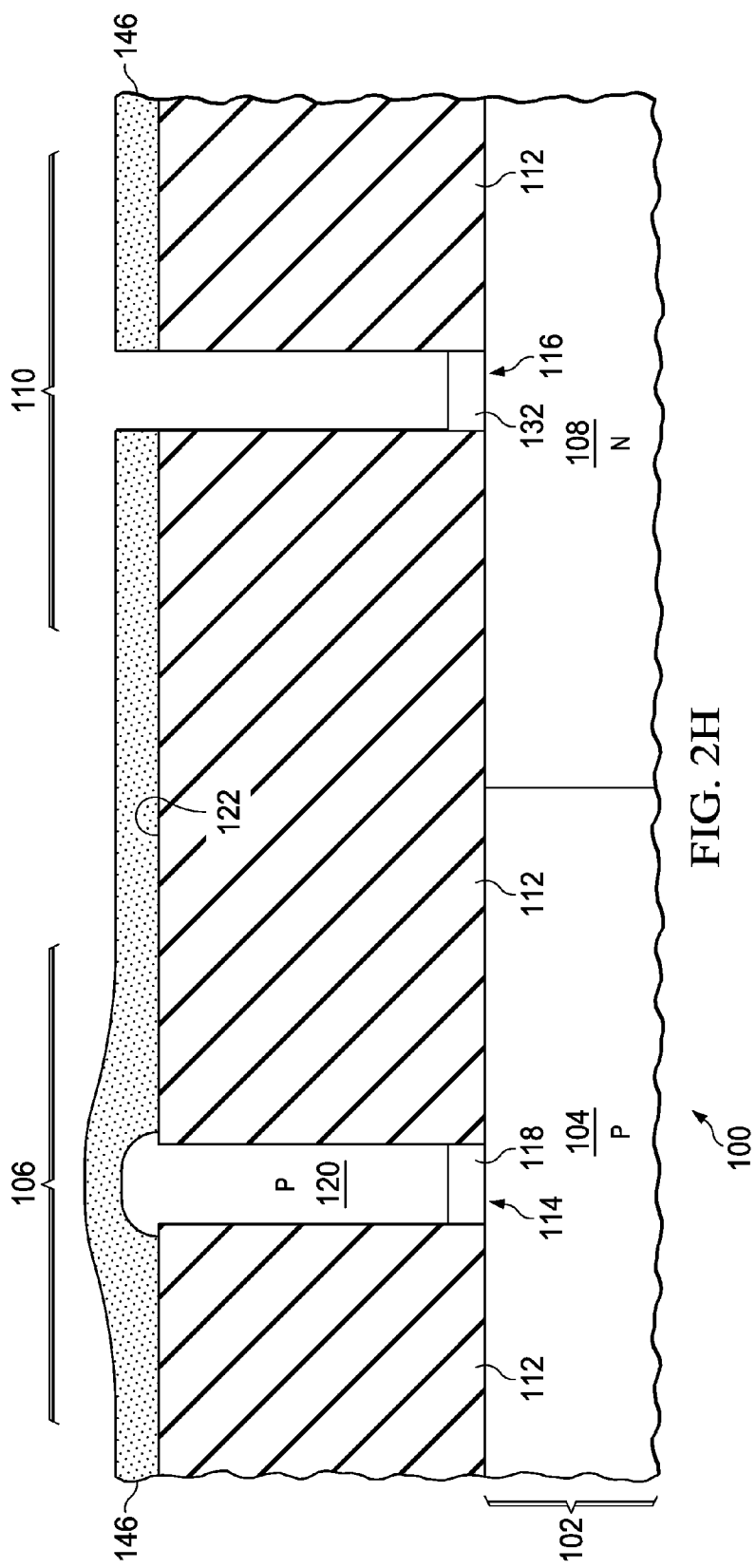

Referring to FIG. 2H, the second silicon-germanium buffer 132 is formed on the substrate 102 in the second trench 116. Formation of the second silicon-germanium buffer 132 may use a same or similar process as used to form the first silicon-germanium buffer 118. The atomic fraction of germanium at the substrate 102 may be less than 20 percent and the atomic fraction of germanium at the top of the second silicon-germanium buffer 132 may be greater than 80 percent, to advantageously provide good lattice matching to the substrate 102 and to the to-be-formed p-channel fin 134.

Figure 2I:
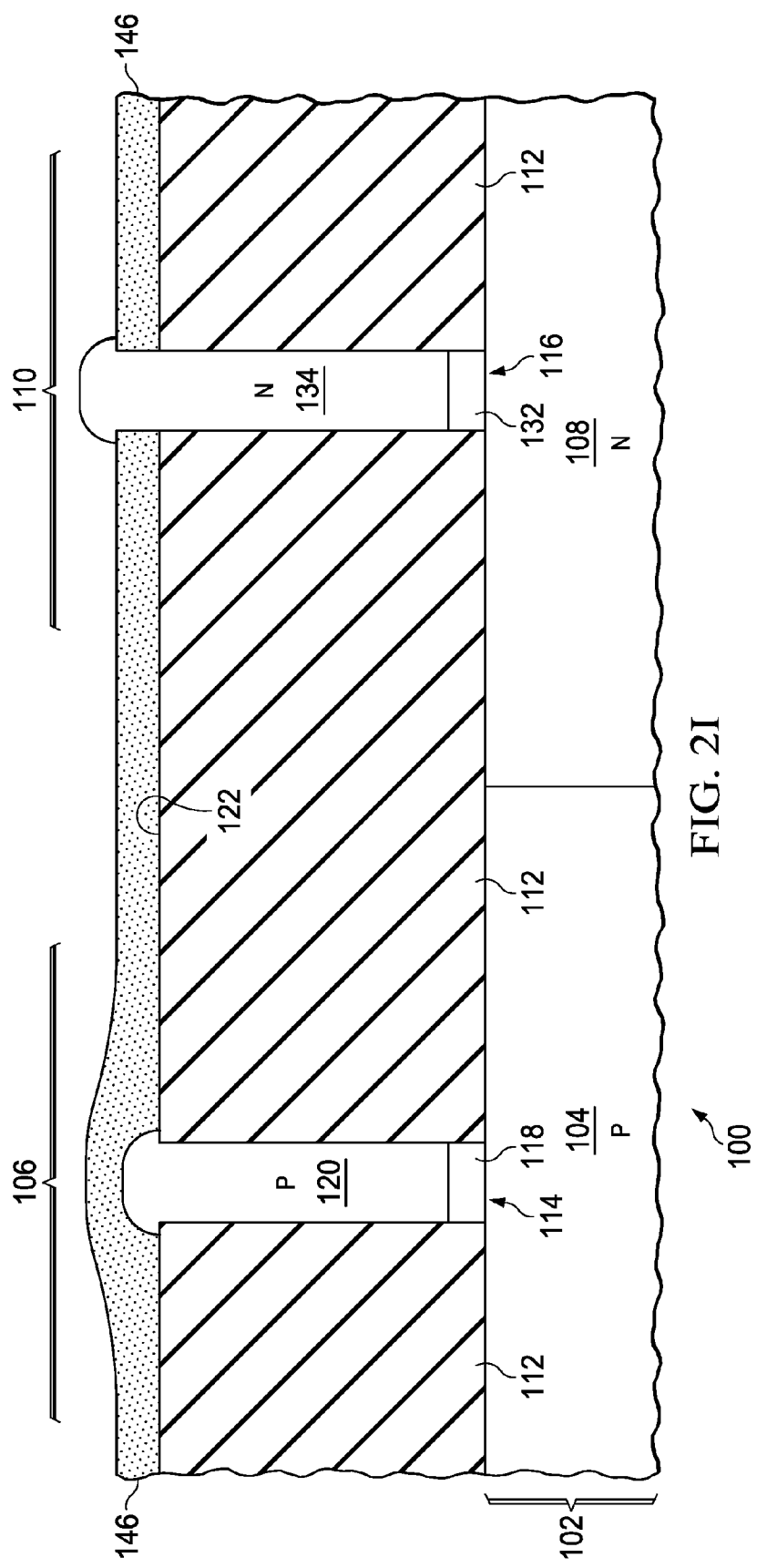

Referring to FIG. 2I, the p-channel fin 134 is formed on the second silicon-germanium buffer 132, extending past the top surface 122 of the dielectric layer 112, and possibly past a top surface of the epitaxy blocking layer 146 as shown in FIG. 2H. The second silicon-germanium buffer 132 advantageously facilitates epitaxial growth of the semiconductor material of the p-channel fin 134, which would be problematic to grow directly on the silicon substrate 102. The p-channel fin 134 may be primarily germanium, or primarily silicon-germanium, and may be formed by a vapor phase epitaxial process as described in reference to FIG. 2D. Alternatively, the p-channel fin 134 may be formed by an MBE process.

Figure 2J:
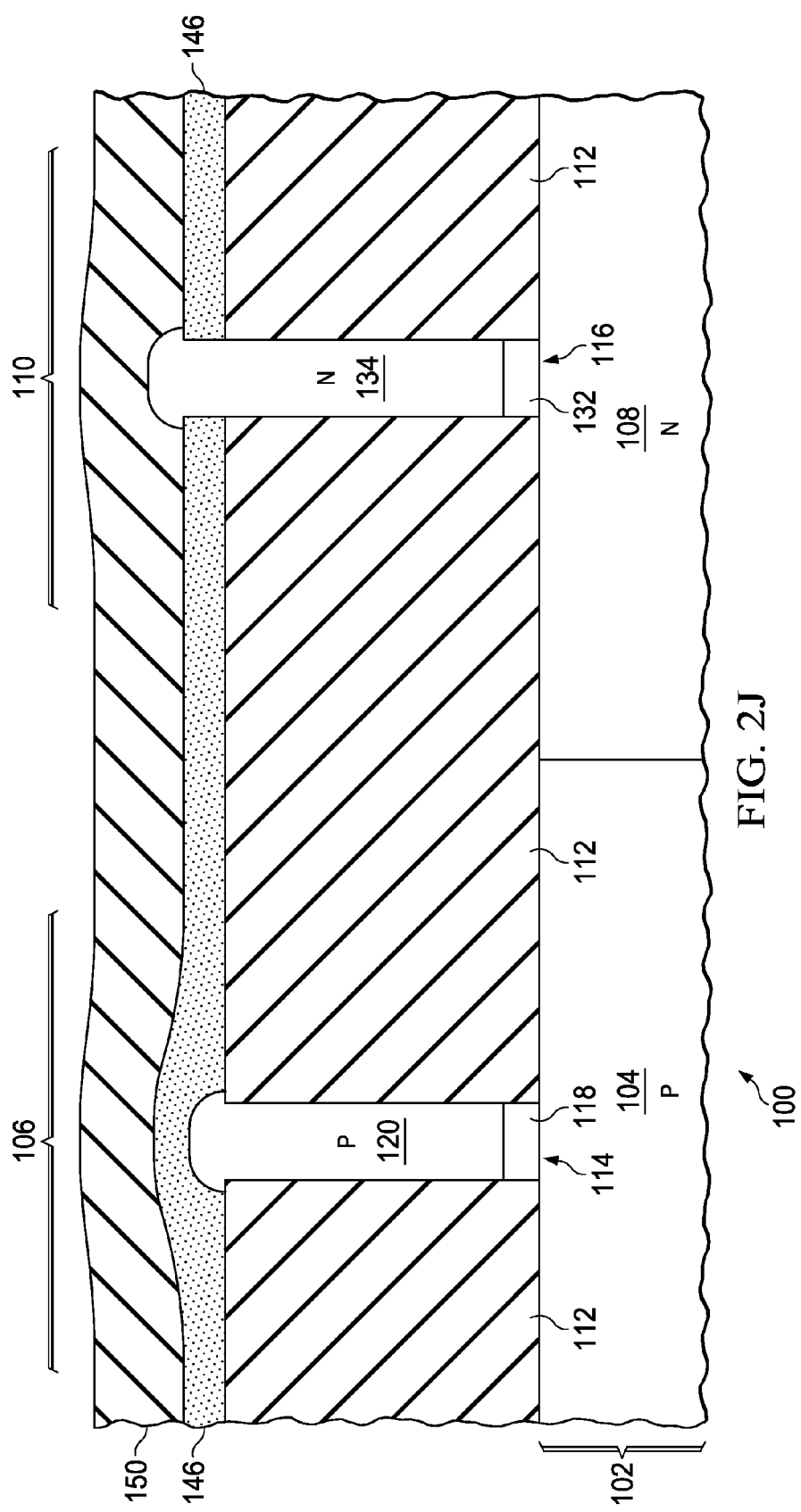

Referring to FIG. 2J, a cap layer 150 is formed over the epitaxy blocking layer 146, covering the p-channel fin 134. The cap layer 150 may include silicon dioxide, silicon nitride, and/or silicon oxynitride, 20 nanometers to 30 nanometers thick. The cap layer 150 may be formed by a PECVD process using TEOS for silicon dioxide and/or bis (tertiary-butylamino) silane (BTBAS) for silicon nitride, at 500° C. to 600° C.

Figure 2K:
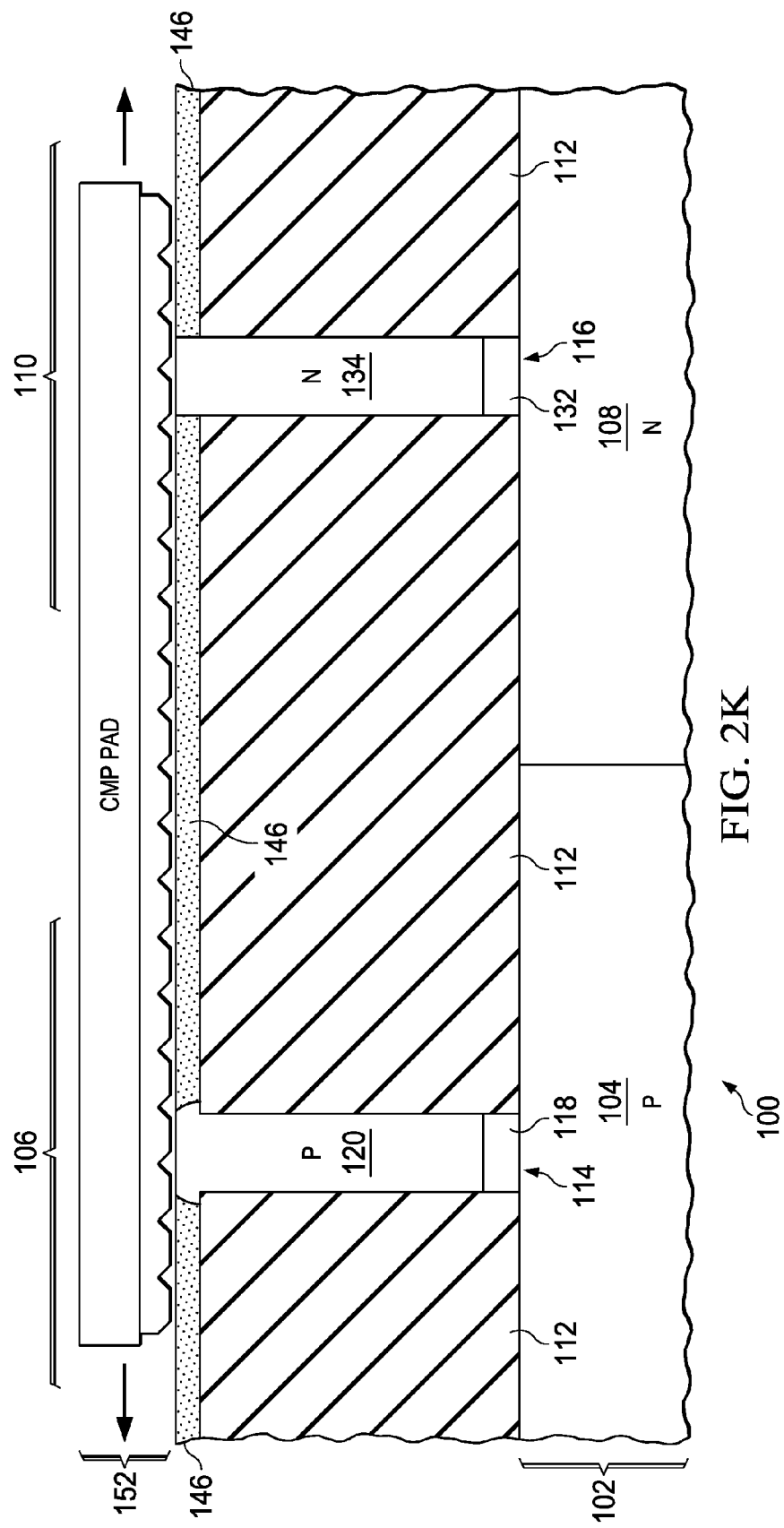

Referring to FIG. 2K, a CMP process 152, depicted schematically as a CMP Pad 152, removes the cap layer 150 of FIG. 2J and the epitaxy blocking layer 146 and planarizes the n-channel fin 120 and the p-channel fin 134 down to the dielectric layer 112. An endpoint for the CMP process 152 may be provided by a change in polishing resistance between the epitaxy blocking layer 146 and the dielectric layer 112, due to the epitaxy blocking layer 146 comprising silicon nitride or silicon oxynitride and the dielectric layer 112 comprising silicon dioxide.

Figure 2L:
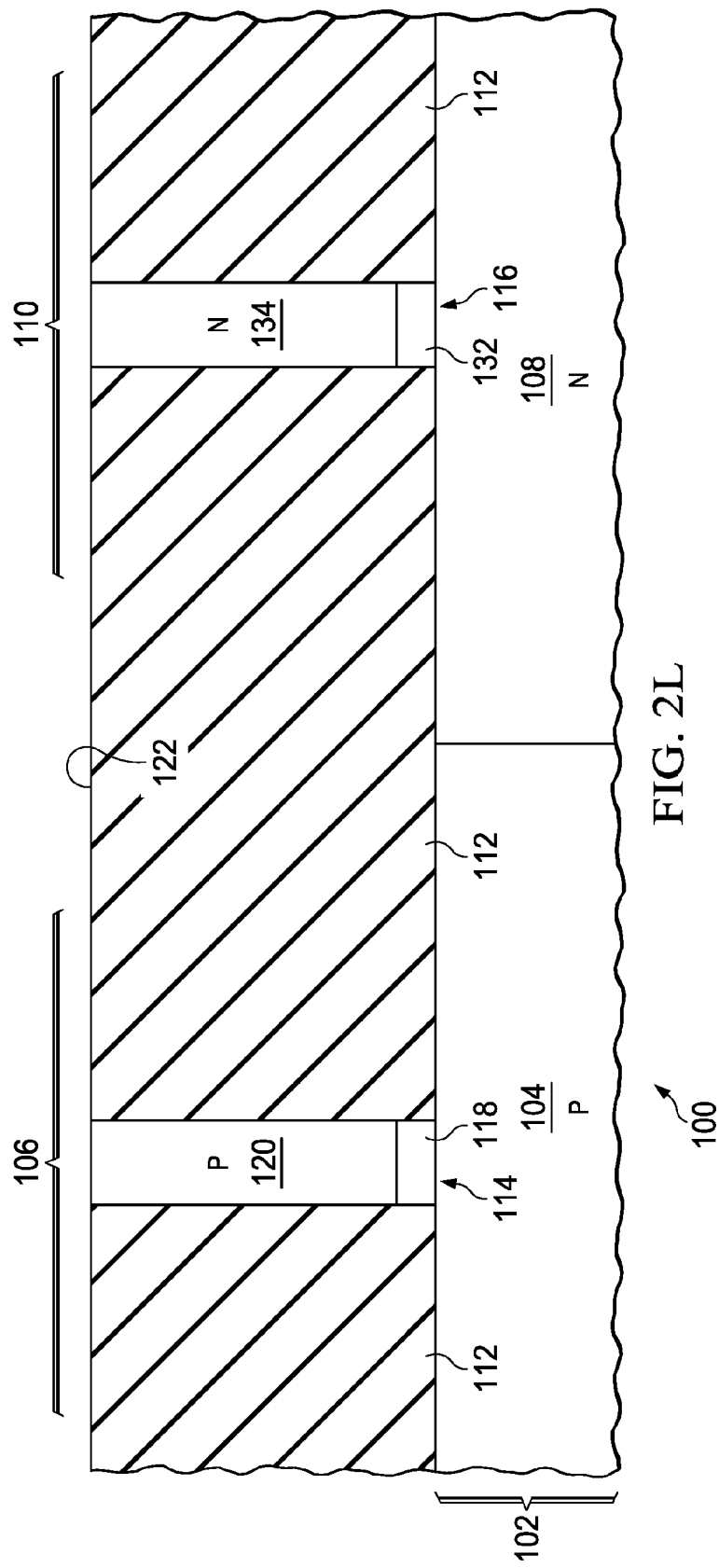

FIG. 2L depicts the integrated circuit 100 after the CMP process 152 of FIG. 2K is completed. The n-channel fin 120 and the p-channel fin 134 may be substantially coplanar with the top surface 122 of the dielectric layer 112.

Figure 2M:
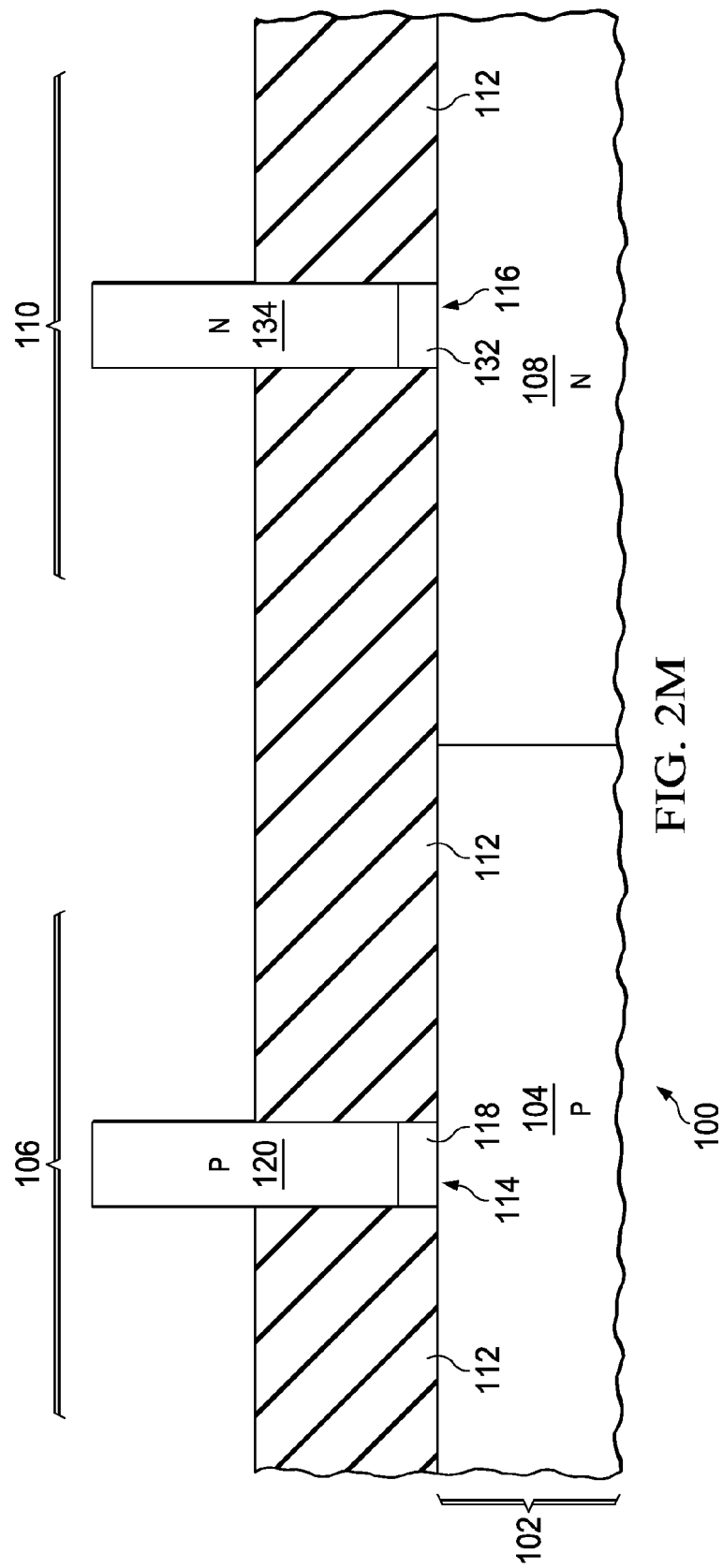

Referring to FIG. 2M, the dielectric layer 112 is recessed without significantly removing semiconductor material from the n-channel fin 120 and the p-channel fin 134 so that the n-channel fin 120 and the p-channel fin 134 extend at least 10 nanometers above the recessed dielectric layer 112. The dielectric layer 112 may be recessed by a plasma etch which is selective to the dielectric material, such as silicon dioxide, of the dielectric layer 112 relative to the semiconductor material of the n-channel fin 120 and the p-channel fin 134. Alternatively, the dielectric layer 112 may be recessed by a wet etch, such as a dilute buffered aqueous solution of hydrofluoric acid, which is selective to the dielectric material, such as silicon dioxide, of the dielectric layer 112 relative to the semiconductor material of the n-channel fin 120 and the p-channel fin 134. After the dielectric layer 112 is recessed, gate dielectric layers and gates are formed over the n-channel fin 120 and the p-channel fin 134 to provide the structure of FIG. 1. The structure of FIG. 2M may also be obtained by an alternative example fabrication sequence in which the p-channel fin 134 is formed before the n-channel fin 120.

Figure 3A:
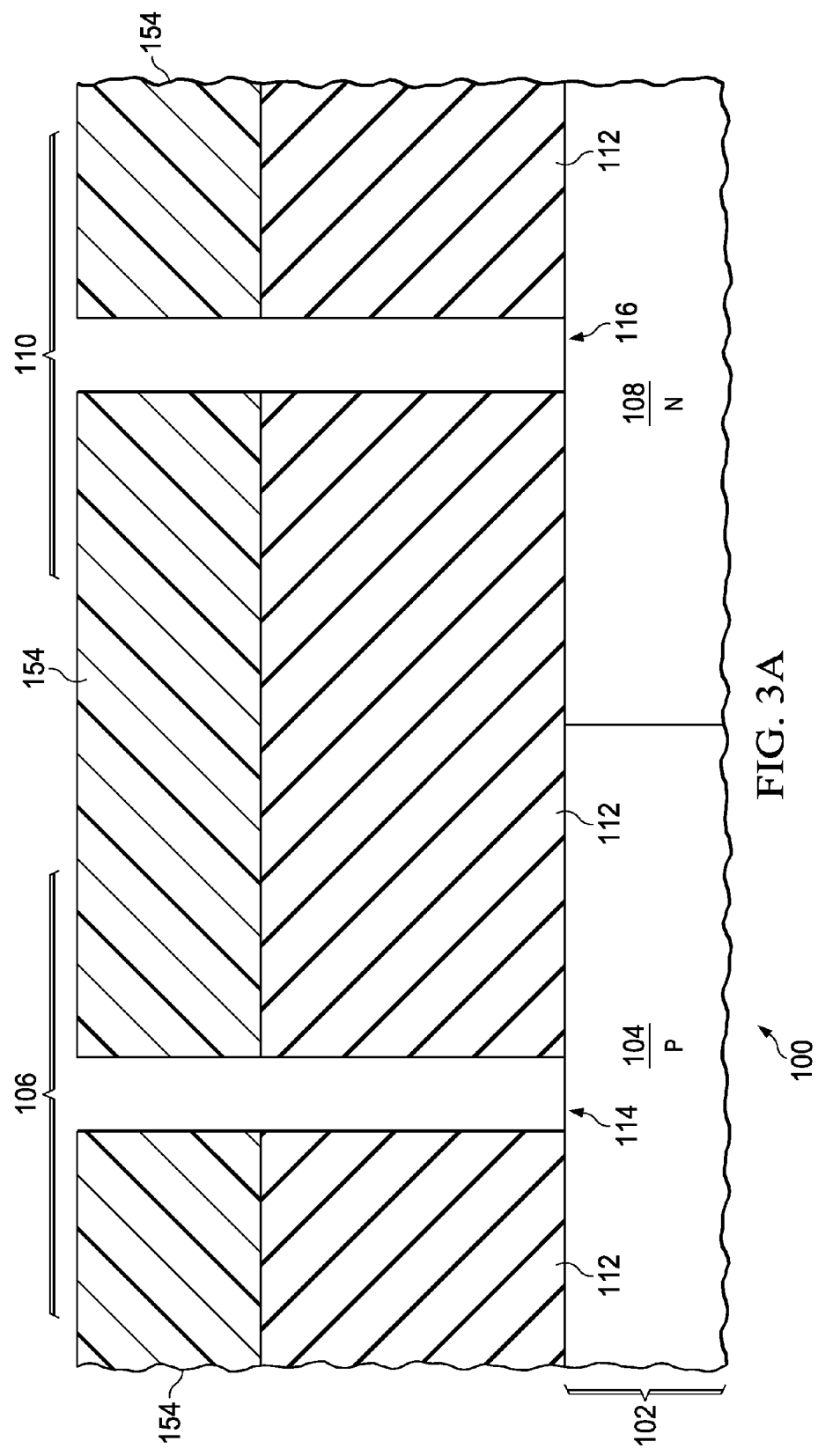
FIG. 3A through FIG. 3G are cross sections of the integrated circuit of FIG. 1, depicted in successive stages of another example fabrication sequence.

FIG. 3A through FIG. 3G are cross sections of the integrated circuit of FIG. 1, depicted in successive stages of another example fabrication sequence. Referring to FIG. 3A, the silicon substrate 102 is provided for forming the integrated circuit 100. The dielectric layer 112 is formed over the substrate 102 with an initial thickness of 50 nanometers to 100 nanometers. A trench mask 154 is formed over the dielectric layer 112 so as to expose areas for the first trench 114 and the second trench 116 of FIG. 1. The first trench 114 and the second trench 116 are formed through the dielectric layer 112 to expose the substrate 102 by etching the dielectric layer 112 in areas exposed by the trench mask 154. After the first trench 114 and the second trench 116 are formed, the trench mask 154 is removed.

Figure 3B:
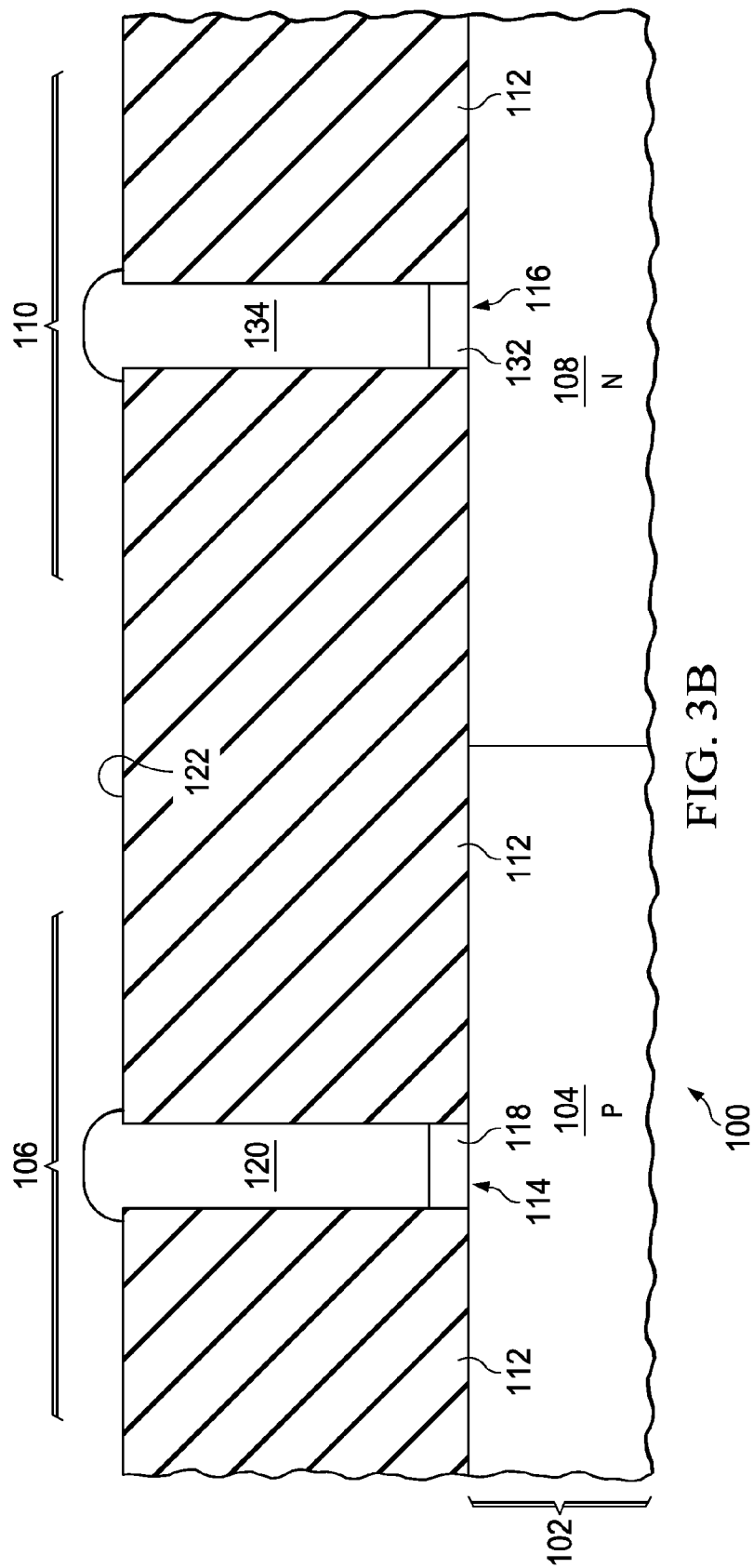

Referring to FIG. 3B, the first silicon-germanium buffer 118 and the second silicon-germanium buffer 132 are formed concurrently on the substrate 102 in the first trench 114 and the second trench 116, respectively, as described in reference to FIG. 2C and FIG. 2H. In the instant example, the first silicon-germanium buffer 118 and the second silicon-germanium buffer 132 have a same composition and same profile of the germanium atomic fraction.

The n-channel fin 120 and the p-channel fin 134 are formed concurrently on the first silicon-germanium buffer 118 and the second silicon-germanium buffer 132, respectively, extending past the top surface 122 of the dielectric layer 112, as described in reference to FIG. 2D and FIG. 2I. In the instant example, the n-channel fin 120 and the p-channel fin 134 have a same composition. The semiconductor material of the n-channel fin 120 and the p-channel fin 134 has a higher electron mobility and a higher hole mobility than silicon. The semiconductor material of the n-channel fin 120 and the p-channel fin 134 may be substantially undoped or lightly doped, may be doped n-type during the epitaxial growth process, or may be doped p-type during the epitaxial growth process. Forming the n-channel fin 120 and the p-channel fin 134 concurrently may advantageously reduce fabrication cost and complexity of the integrated circuit 100.

Figure 3C:
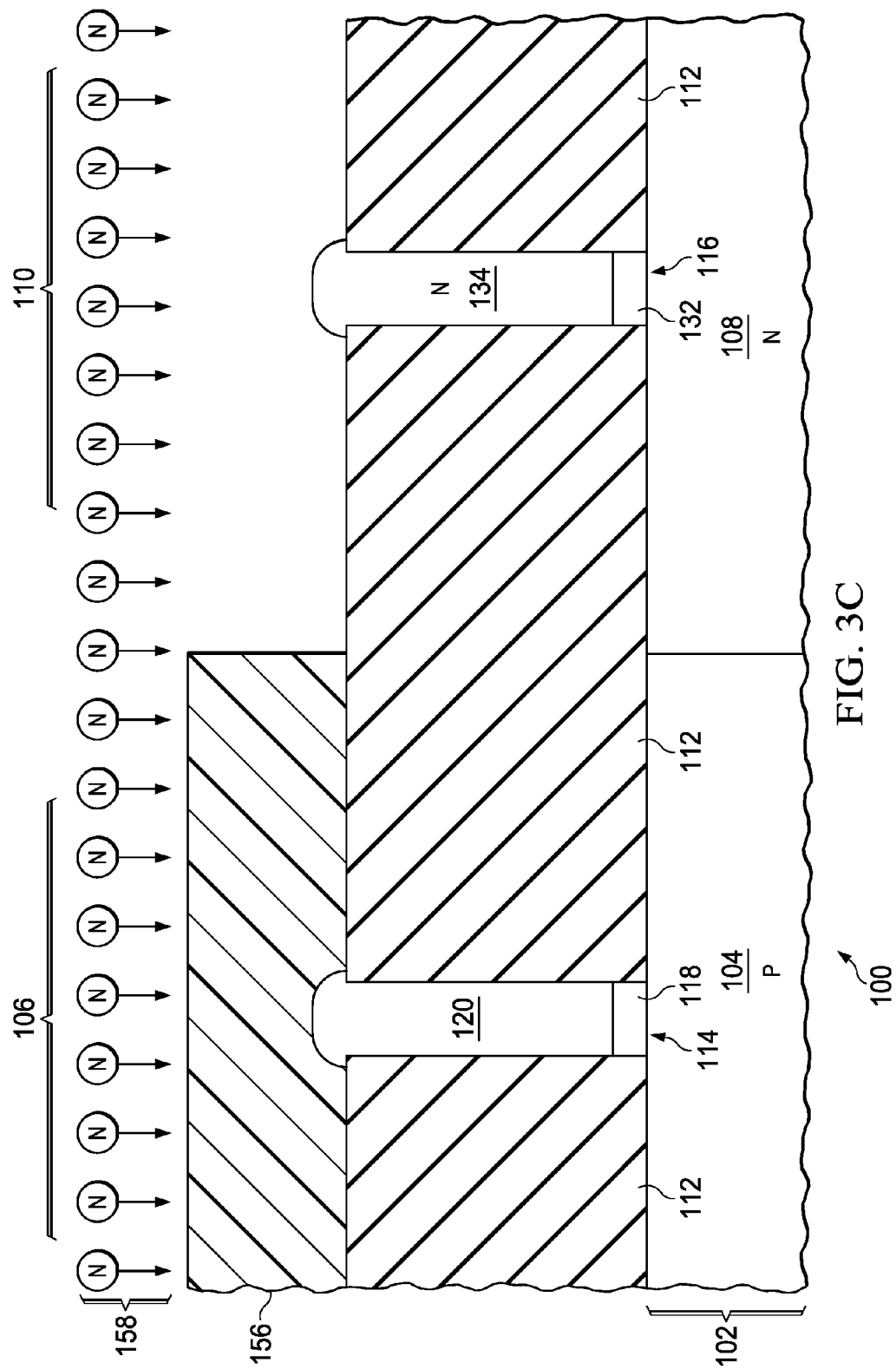

Referring to FIG. 3C, an optional first implant mask 156 may be formed over the dielectric layer 112 so as to expose the p-channel fin 134 and to cover the n-channel fin 120. N-type dopants 158 such as phosphorus and possibly arsenic may be implanted into the p-channel fin 134, if needed, at a dose which provides a desired threshold voltage for the p-channel finFET 110. The dose will depend on the desired threshold voltage and on a height of the p-channel fin 134. The first implant mask 156 is removed after the n-type dopants 158 are implanted. An anneal operation is subsequently performed to activate the implanted n-type dopants 158.

Figure 3D:
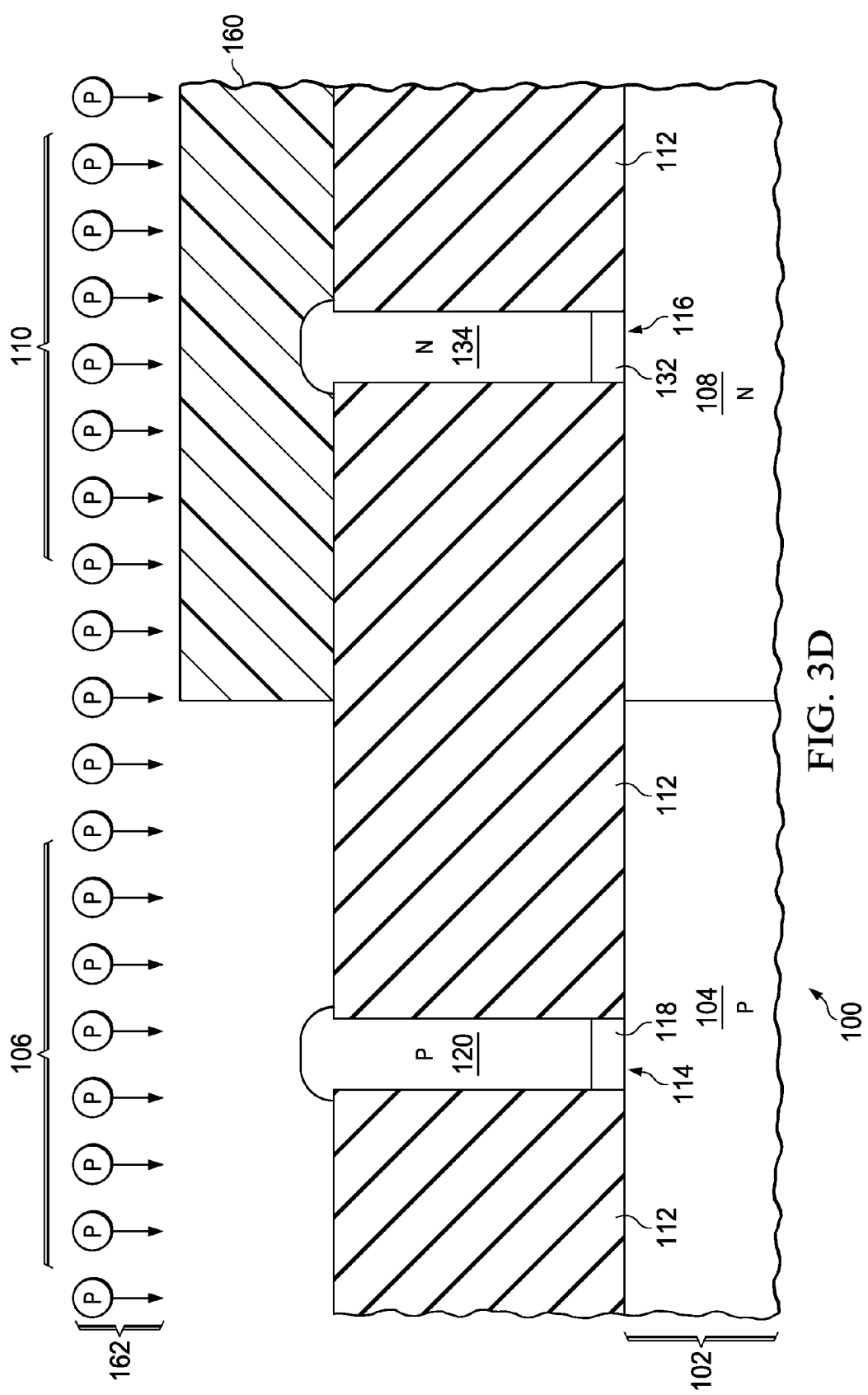

Referring to FIG. 3D, an optional second implant mask 160 may be formed over the dielectric layer 112 so as to expose the n-channel fin 120 and to cover the p-channel fin 134. P-type dopants 162 such as boron may be implanted into the n-channel fin 120, if needed, at a dose which provides a desired threshold voltage for the n-channel finFET 106. The dose will depend on the desired threshold voltage and on a height of the n-channel fin 120. The second implant mask 160 is removed after the p-type dopants 162 are implanted. An anneal operation is subsequently performed to activate the implanted p-type dopants 162.

Figure 3E:
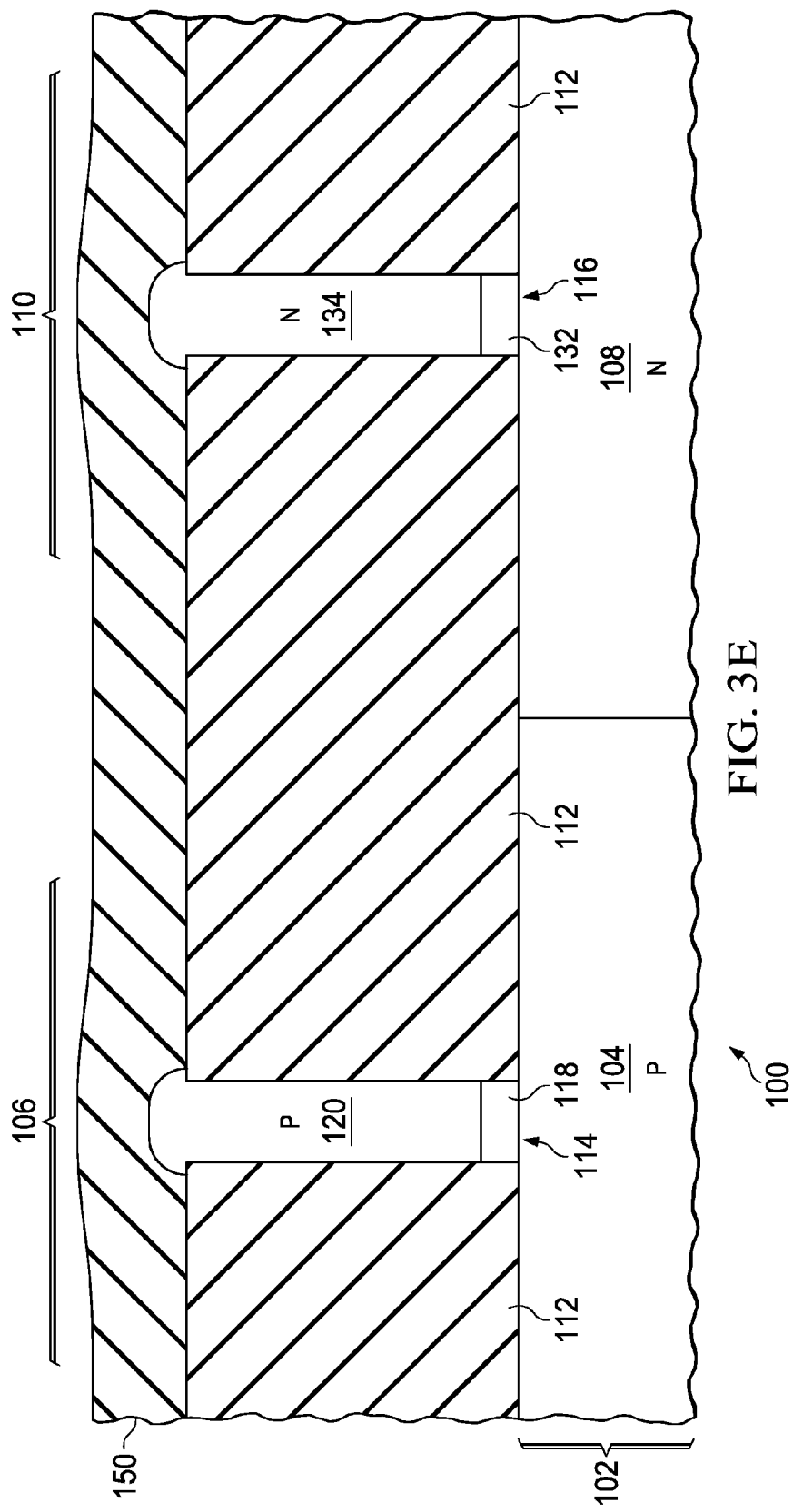

Referring to FIG. 3E, the cap layer 150 is formed over the dielectric layer 112, covering the n-channel fin 120 and the p-channel fin 134. In the instant example, the cap layer 150 may include silicon nitride, and/or silicon oxynitride, 20 nanometers to 30 nanometers thick. The cap layer 150 may be formed as described in reference to FIG. 2J.

Figure 3F:
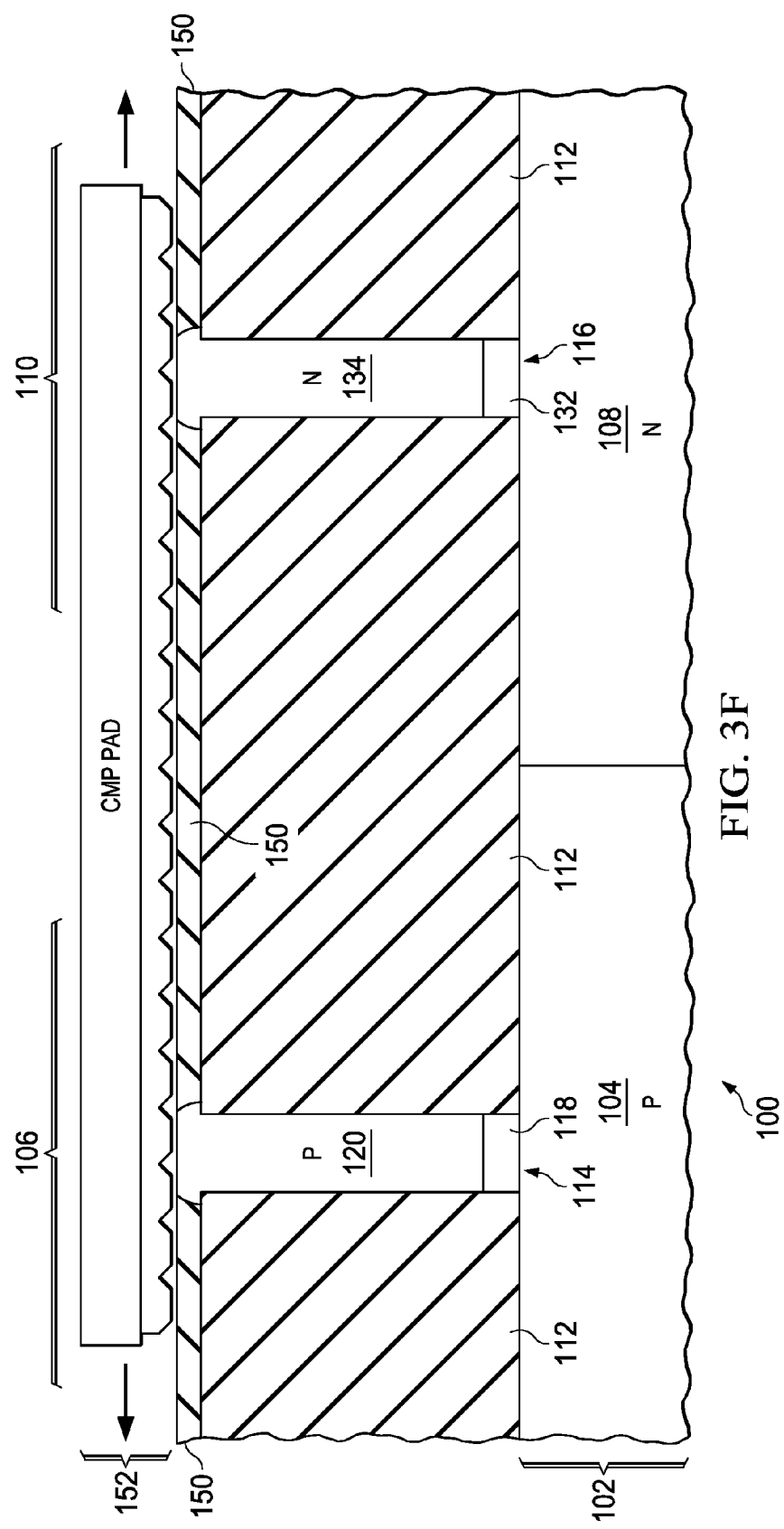

Referring to FIG. 3F, a CMP process 152, depicted schematically as a CMP Pad 152, removes the cap layer 150 and planarizes the n-channel fin 120 and the p-channel fin 134 down to the dielectric layer 112. An endpoint for the CMP process 152 may be provided by a change in polishing resistance between the cap layer 150 and the dielectric layer 112, due to the cap layer 150 comprising silicon nitride or silicon oxynitride and the dielectric layer 112 comprising silicon dioxide.

Figure 3G:
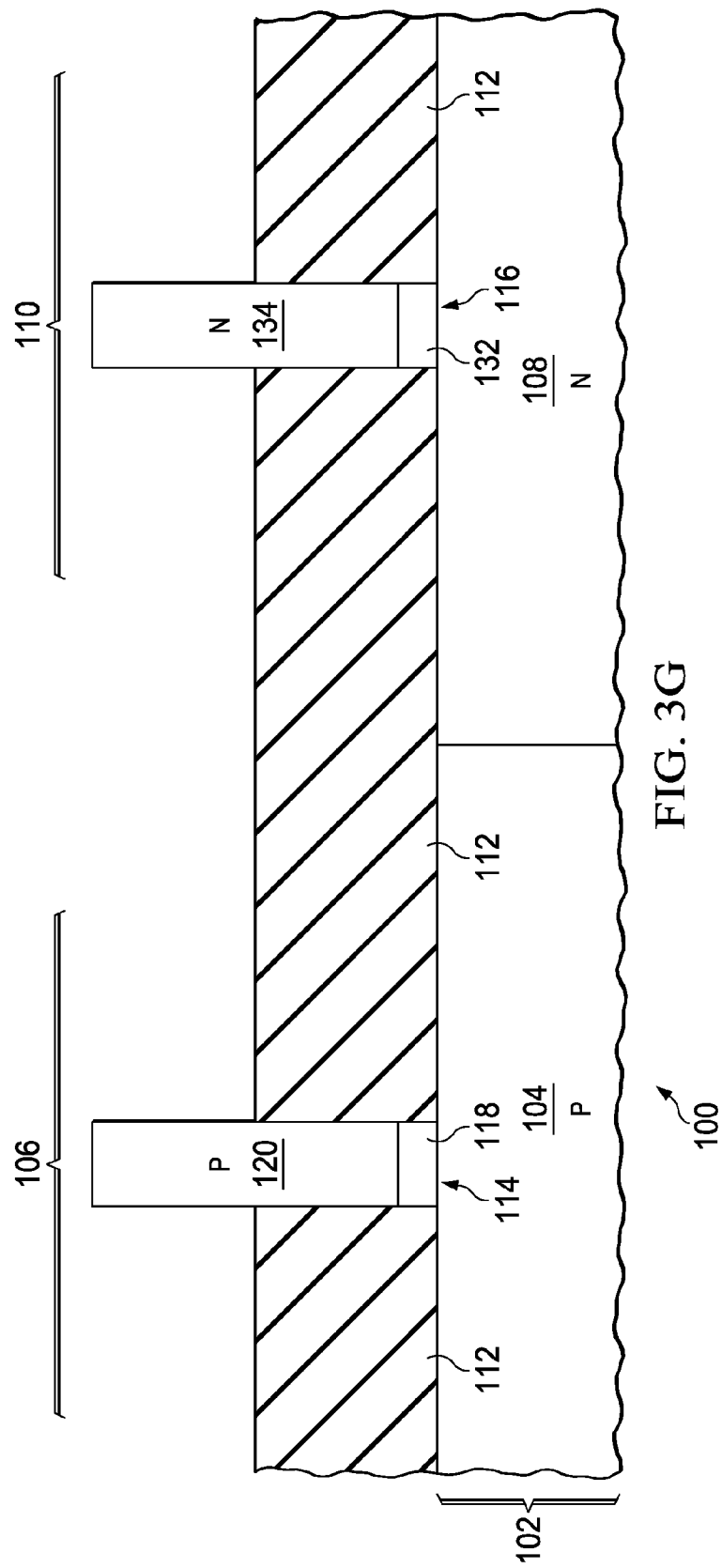

Referring to FIG. 3G, the dielectric layer 112 is recessed without significantly removing semiconductor material from the n-channel fin 120 and the p-channel fin 134 so that the n-channel fin 120 and the p-channel fin 134 extend at least 10 nanometers above the recessed dielectric layer 112, as described in reference to FIG. 2M. After the dielectric layer 112 is recessed, gate dielectric layers and gates are formed over the n-channel fin 120 and the p-channel fin 134 to provide the structure of FIG. 1.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
   providing a substrate comprising silicon, said substrate having a first region of a first conductivity type in an area for a first polarity finFET and having a second region of a second, opposite, conductivity type in an area for a second, opposite, polarity finFET;
   forming a dielectric layer over said substrate;
   concurrently forming a first trench in said dielectric layer down to said substrate in said area for said first polarity finFET and a second trench in said dielectric layer down to said substrate in said area for said second polarity finFET;
   concurrently forming a first silicon germanium buffer on said substrate in said first trench and a second silicon germanium buffer on said substrate in said second trench;
   concurrently forming a first polarity fin of said first polarity finFET on said first silicon germanium buffer and a second polarity fin of said second polarity finFET on said second silicon germanium buffer, so that said first polarity fin and said second polarity fin extend above a top surface of said dielectric layer;
   forming a cap layer of dielectric material over said dielectric layer so as to cover said first polarity fin and said second polarity fin;
   removing said cap layer by a CMP process so as to planarize said first polarity fin and said second polarity fin down to said dielectric layer; and
   recessing said dielectric layer so that said first polarity fin and said second polarity fin extend at least 10 nanometers above said dielectric layer.

2. The method of claim 1, wherein said first silicon germanium buffer and said second silicon germanium buffer are formed to have germanium atomic fractions at said substrate of less than 20 percent and germanium atomic fractions at top surfaces of said first silicon germanium buffer and said second silicon germanium buffer over 80 percent.

3. The method of claim 1, wherein said first polarity fin and said second polarity fin comprise germanium.

4. The method of claim 1, wherein said first polarity fin comprises gallium arsenide.

5. The method of claim 1, wherein said first polarity fin comprises indium gallium arsenide.

6. The method of claim 5, wherein said first polarity fin has an indium to gallium ratio of 50:50 to 57:43.

7. The method of claim 1, wherein said first polarity fin comprises indium phosphide.

8. A method of forming an integrated circuit, comprising the steps:

providing a substrate comprising silicon, said substrate having a first region of a first conductivity type in an area for a n-channel finFET and having a second region of a second, opposite, conductivity type in an area for a p-channel finFET;

forming a dielectric layer over said substrate;

concurrently forming a first trench in said dielectric layer down to said substrate in said area for said n-channel finFET and a second trench in said dielectric layer down to said substrate in said area for said p-channel finFET;

concurrently forming a first silicon germanium buffer on said substrate in said first trench and a second silicon germanium buffer on said substrate in said second trench;

concurrently forming a n-channel fin of said n-channel finFET directly on said first silicon germanium buffer and a p-channel fin of said p-channel finFET directly on said second silicon germanium buffer, so that said n-channel fin and said p-channel fin extend above a top surface of said dielectric layer;

forming a cap layer of dielectric material over said dielectric layer so as to cover said n-channel fin and said p-channel fin;

removing said cap layer by a CMP process so as to planarize said n-channel fin and said p-channel fin down to said dielectric layer; and recessing said dielectric layer so that said n-channel fin and said p-channel fin extend at least 10 nanometers above said dielectric layer.

9. The method of claim 8, wherein said first silicon germanium buffer and said second silicon germanium buffer are formed to have germanium atomic fractions at said substrate of less than 20 percent and germanium atomic fractions at top surfaces of said first silicon germanium buffer and said second silicon germanium buffer over 80 percent.

10. The method of claim 8, wherein said n-channel fin and said p-channel fin comprise germanium.

11. The method of claim 8, wherein said n-channel fin comprises gallium arsenide.

12. The method of claim 8, wherein said n-channel fin comprises indium gallium arsenide.

13. The method of claim 12, wherein said n-channel fin has an indium to gallium ratio of 50:50 to 57:43.

14. The method of claim 8, wherein said n-channel fin comprises indium phosphide.

* * * * *